United States Patent [19]
Inam et al.

[11] Patent Number: 5,155,658
[45] Date of Patent: Oct. 13, 1992

[54] CRYSTALLOGRAPHICALLY ALIGNED FERROELECTRIC FILMS USABLE IN MEMORIES AND METHOD OF CRYSTALLOGRAPHICALLY ALIGNING PEROVSKITE FILMS

[75] Inventors: Arun Inam, Red Bank; Ramamoorthy Ramesh, Eatontown, both of N.J.

[73] Assignee: Bell Communications Research, Inc., Livingston, N.J.

[21] Appl. No.: 846,358

[22] Filed: Mar. 5, 1992

[51] Int. Cl.$^5$ .................... H01G 4/10; H01B 12/00; G11C 11/22
[52] U.S. Cl. .................................. 361/321; 365/145
[58] Field of Search ............... 361/321, 311, 312, 313; 365/145; 505/1; 357/51

[56] References Cited
U.S. PATENT DOCUMENTS

| | | | |
|---|---|---|---|
| 4,677,336 | 6/1987 | Kushida et al. | 310/334 |
| 5,038,323 | 8/1991 | Schwee | 365/145 |
| 5,046,043 | 9/1991 | Miller et al. | 365/145 |
| 5,063,539 | 11/1991 | Rallapalli | 365/145 |
| 5,077,270 | 12/1991 | Takeda et al. | 505/1 |

OTHER PUBLICATIONS

R. Ramesh et al., "Epitaxial Cuprate Superconductor/-Ferroelectric Heterostructures," *Science,* 1991, vol. 252, pp. 944-946.
R. Ramesh et al., "Ferroelectric PbZr$_{0.2}$Ti$_{0.8}$O$_3$ thin films on epitaxial Y-Ba-Cu-O," *Applied Physics Letters,* 1991, vol. 27, pp. 3542-3544.
J. F. Scott et al., "Raman spectroscopy of submicron KNO$_3$ films. II. Fatigue and space-charge effects," *Journal of Applied Physics,* 1988, vol. 64, pp. 1547-1551.
A Inam et al., "a-axis oriented epitaxial YBa$_2$Cu$_3$O$_{7-x}$-PrBa$_2$Cu$_3$O$_{7-y}$ heterostructures," *Applied Physics Letters,* 1990, vol. 56, pp. 2484-2486.

*Primary Examiner*—Donald Griffin
*Attorney, Agent, or Firm*—Leonard Charles Suchyta; Charles S. Guenzer

[57] ABSTRACT

A ferroelectric memory and its method of making in which a highly c-axis oriented layer (56) of ferroelectric lead zirconate titanate (PZT) is epitaxially deposited at between 640° and 710° C. upon a crystalline film (54) of yttrium barium copper oxide (YBCO), acting both as growth template and bottom electrode. A top electrode (58) is formed over the ferroelectric layer to complete the memory element. The two electrodes are preferably composed of the same perovskite conductor of the same cyrstalline orientation, most preferably, a-axis oriented YBCO. The structure can be grown on a silicon substrate (50) with an intermediate buffer layer (52) of yttria-stabilized zirconia. The ferroelectric behavior is optimized if the structure is cooled from its growth temperature at about 20° C./min. Such a–axis oriented perovskite thin films can be grown by continuously depositing the same or different perovskite material, but dividing the deposition into three temperature stages, a first at a temperature favoring a-axis oriented growth, a second gradually increasing the temperature to a temperature favoring c-axis growth, and a third at the c-axis growth temperature. Nonetheless, a high-quality a-axis oriented film is grown. The memory can be rejuvenated after it has become fatigued by applying a pulse of magnitude equal to that of the writing pulse but of considerably longer duration.

24 Claims, 5 Drawing Sheets

CRYSTALLOGRAPHICALLY ALIGNED FERROELECTRIC FILMS USABLE IN MEMORIES AND METHOD OF CRYSTALLOGRAPHICALLY ALIGNING PEROVSKITE FILMS

FIELD OF THE INVENTION

The invention relates generally to ferroelectric thin films and to perovskite thin films and to their method of fabrication. In particular, the invention relates to non-volatile memories incorporating such ferroelectric thin films and to the method of growing oriented perovskite thin films usable with non-volatile memories.

BACKGROUND ART

Ferroelectric memories have received much attention as dense, randomly addressable, non-volatile memories. A ferroelectric memory element is essentially a capacitor consisting of two electrodes and ferroelectric material filling the gap between the electrodes. At a minimum, the ferroelectric material has a very high dielectric constant, thus providing an improved dynamic random-access memory (DRAM) capacitor. Furthermore, the electrodes can induce two stable polarization states in the ferroelectric dependent on the polarity of the applied voltage, and the ferroelectric remains in the selected state after the voltage has been removed from the electrode. Thus, a ferroelectric memory can be non-volatile.

Early ferroelectric memories relied on relatively thick ferroelectric bodies on opposing side of which electrodes were formed, for example, by deposition. Such a configuration is incompatible with large-scale integration and requires operational voltages considerably higher than those used with semiconductor integrated circuits. In later ferroelectric memories, a ferroelectric thin film was deposited on a metallic bottom electrode, and a top electrode was deposited on the ferroelectric thin film. This configuration and fabrication process, similar to those in semiconductor memories, offer much promise, but the polycrystalline structure of the ferroelectric film resulting from the metal substrate introduces many problems.

Recently, Ramesh et al. have disclosed singly crystalline, epitaxially grown ferroelectric memories in U.S. patent application, Ser. No. 07/616,166, filed Nov. 10, 1990, in "Epitaxial Cuprate Superconductor/Ferroelectric Heterostructures," *Science*, volume 252, May 17, 1991, pp. 944–946, and in "Ferroelectric $PbZr_{0.2}Ti_{0.8}O_3$ thin films on epitaxial Y-Ba-Cu-O," *Applied Physics Letters*, volume 59, Dec. 30, 1991, pp. 3542–3544. The patent application is incorporated herein by reference. The bottom electrode of these memories is a singly crystalline thin film of a high-temperature perovskite superconductor, for example, $YBa_2Cu_3O_{7-x}$ (hereinafter YBCO). The ferroelectric thin film is then epitaxially deposited on the YBCO film, and, although it is cubic or nearly cubic, its crystalline orientation epitaxially follows the underlying perovskite crystalline orientation.

Although YBCO is a superconductor at temperatures of less than 92° K., the ferroelectric memories described above are intended to operate at room temperature where the YBCO exhibits high but normal conductivity, rather than the semiconductive or dielectric behavior observed in most non-superconducting perovskites.

The ferroelectric memories of Ramesh et al., although impressive, suffered from many problems. Their hysteresis curves were insufficiently square, with low coercive fields. Such memory elements would require relatively complicated transistorized gates to be written and read. Furthermore, these singly crystalline ferroelectric memory cells aged and fatigued rather rapidly under simulated usage. A typical requirement for volatile semiconductor memories is that they survive $10^{12}$ to $10^{15}$ read/write cycles. Such a high number is probably not required for non-volatile ferroelectric memories, but a minimum life of $10^8$ cycles would be desirable to assure system performance.

SUMMARY OF THE INVENTION

One aspect of the invention may be summarized as a ferroelectric thin film, usable as a non-volatile memory element, and its method of making. A ferroelectric thin film is epitaxially grown on a singly crystalline substrate or thin film of a conductive perovskite material having either an a-axis or a c-axis orientation. The ferroelectric thin film is grown such that at least 80% and preferably 90% of the film has its c-axis oriented perpendicularly to the electrode surface. This high degree of orientation is accomplished by depositing the ferroelectric thin film at a temperature at which it is in a cubic phase and then controllably cooling it across the transition temperature below which it is in a tetragonal or orthorhombic phase. The cooling rate is between 10° C./min and 40° C./min, preferably about 20° C./min. The memory element is completed by depositing a top electrode on the ferroelectric and using the conductive perovskite as the bottom electrode.

The ferroelectric memory is improved if both the electrodes are perovskite thin films of the same material and orientation, for example, of a-axis oriented YBaCuO.

Another aspect of the invention may be summarized as a method of rejuvenating a ferroelectric memory cell from its fatigued state by applying a relatively long pulse of the same magnitude as the pulses used to read and write the memory. The rejuvenation works effectively with a singly crystalline ferroelectric memory cell of the invention.

Yet another aspect of the invention may be summarized as a method of depositing an a,b-axis oriented perovskite thin film. A perovskite thin film is deposited as a template layer upon a substrate at a temperature or other growth parameter favoring a-axis growth. Without interrupting growth, the temperature or growth condition is gradually changed to that favoring c-axis growth. Growth of the final perovskite thin film continues at that temperature or growth condition. Nonetheless, the final film forms as an a,b-axis oriented film.

DETAILED DESCRIPTION OF THE PREFERRED EMBODIMENTS

Figure 1:
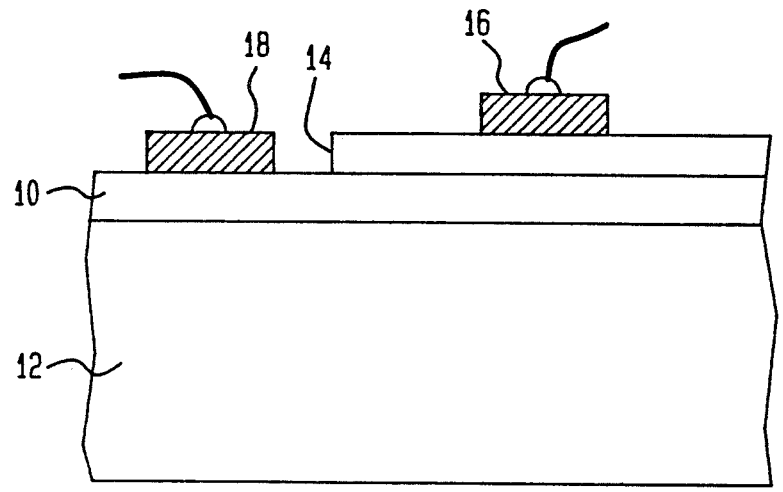
FIG. 1 is a cross-section of a ferroelectric memory element of the present invention.

The general structure of a first embodiment of the ferroelectric memory element of the invention is illustrated in cross-section in FIG. 1 and follows that of Ramesh et al. A conductive perovskite thin film 10 is epitaxially deposited on a singly crystalline substrate 10 and has a c-axis orientation (or preferably an a-axis orientation, as will be explained later). A ferroelectric thin film 14 is epitaxially deposited on the conductive thin film 10. A top electrode 16 is patterned over the ferroelectric thin film 14. The conductive thin film 10 acts as the bottom electrode. The two electrodes 10 and 14 sandwiching the ferroelectric film 14 constitute a capacitor. The ferroelectric layer 14 is patterned to expose the conductive film 10 for application of a bottom contact 18. According to the invention, the ferroelectric film 10 must be highly oriented in the c-direction, at least 80% and preferably 90% of the ferroelectric material being c-axis oriented.

Figure 2:
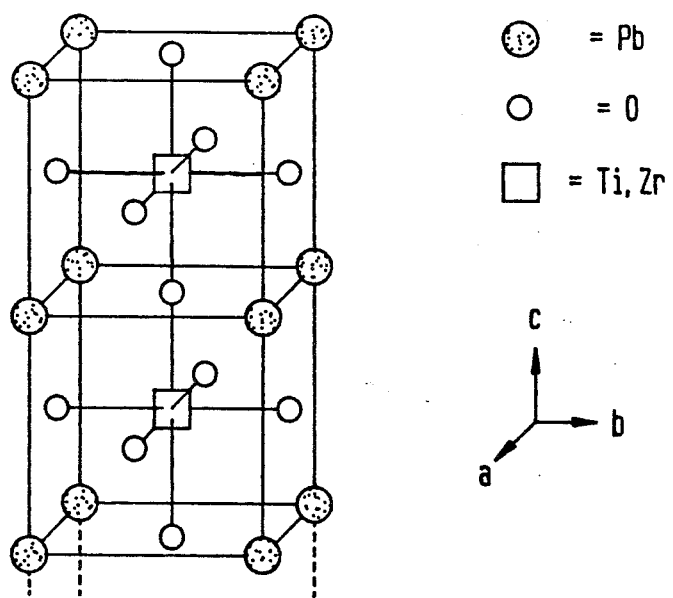
FIG. 2 is a perspective view of a PZT lattice structure, either cubic or tetragonal.

The following discussion will assume that the ferroelectric material is lead zirconate titanate or PZT having the chemical formula $PbZr_xTi_{1-x}O_3$, where $0 < X < 1$. PZT for $x = 0.2$, above 470° C., has a cubic crystal structure illustrated in perspective in FIG. 2 and having equal lattice parameters listed in the table. On the other hand, at temperatures below the structural phase transition at 470° C., PZT has a tetragonal crystal structure with the lattice parameters listed in the table so that the lattice spacing along the c-axis is somewhat longer than that along the a- or b-axis.

| Material | Structure | Lattice Parameters | | |
|---|---|---|---|---|
| | | a (nm) | b (nm) | c (nm) |
| PZT | cubic | 0.399 | 0.399 | 0.399 |
| PZT | tetragonal | 0.395 | 0.395 | 0.411 |
| YBCO | orthorhombic | 0.383 | 0.398 | 1.168 |

The ferroelectric film is grown above its transition temperature. The structural transition upon cooling is accompanied by a displacement of the Zr or Ti ion, either up or down along the c-axis, from the body center of the cubic structure. The choice of the two directions provides the two stable polarizations of the ferroelectric materials in which the c-axis is the preferred direction of ferroelectric polarization.

Figure 3:
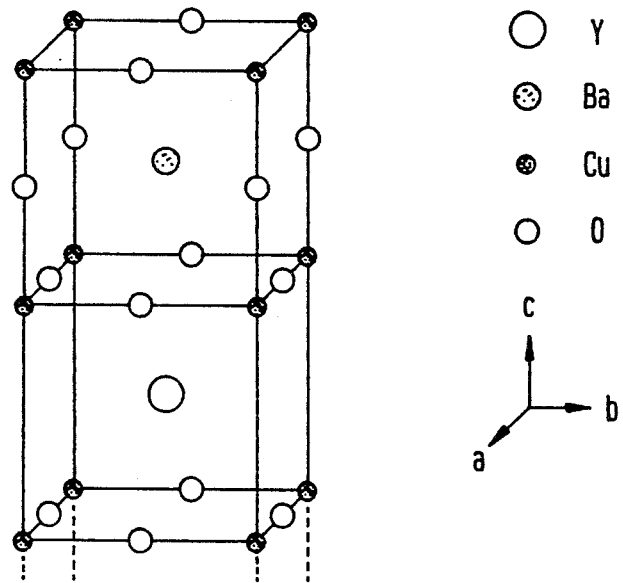
FIG. 3 is a perspective view of an orthorhombic lattice structure.

The ferroelectric film 14 is grown on the conductive perovskite film 10, which may be a metal oxide of either a cuprate oxide or a bismuthal oxide, both of which have members which exhibit superconductivity at low temperatures and which exhibit substantial conductivity at room temperature. The most well developed example of the cuprate oxides is the superconductor $YBa_2Cu_3O_{7-x}$ (YBCO), which has an orthorhombic crystal structure illustrated in FIG. 3 with the lattice parameters listed in the table. This material has a slight oxygen deficiency from the purely stoichiometric $YBa_2Cu_3O_7$ determined by the deposition and annealing conditions. The bismuthal oxides have a crystal structure similar to but more complicated than that of YBCO and are well explored in high-$T_c$ superconductivity.

When PZT is deposited at high temperature on c-axis oriented YBCO and cooled through the phase transition, the lattice matching is best when the c-axis of the PZT is parallel to the c-axis of the YBCO, thus leading to a predominantly c-axis orientation of the PZT. However, the phase transition introduces considerable strain in the ferroelectric thin film and the ferroelectric produces a strong depolarizing field, both of which induce the ferroelectric to form as a multi-domain structure in which many of the domains of the tetragonal PZT form with the c-axis lying in the plane of the film. That is, large portions of the ferroelectric film contain a-axis oriented material. It appears that the a-axis or equivalent b-axis is perpendicular to the film. For a good ferroelectric memory, the c-axis orientation should be increased to above 80% and preferably above 90%.

Part of the invention includes the discovery that the a-axis orientation can be virtually eliminated by increasing the cooling rate across the phase transition to rates significantly above those disclosed in the Ramesh et al. patent application. The cooling rate needs to be at least 10° C./min and preferably 20° C./min to obtain substantially all c-axis oriented tetragonal PZT. Other considerations limit the maximum cooling rate to 40° C./min.

EXAMPLE 1

Heterostructures were grown having a substrate 12 of [001]-oriented $LaAlO_3$. A YBCO layer 10 was deposited to a thickness of 100 nm by pulsed laser ablation using 60 ns pulses of 248 nm light with a substrate heater temperature of 810° C. The ferroelectric PZT layer 14 had a composition of $PbZr_{0.2}Ti_{0.8}O_3$ and was deposited to a thickness of 250–270 nm by pulsed laser ablation with a substrate heater temperature of 700° to 715° C. The details of deposition are found in the Ramesh et al. patent and Applied Physics Letters article. After the PZT deposition, the chamber was flushed with oxygen to a pressure of 600 torr, and the structures were cooled from 700° C. to room temperature at various controlled cooling rates.

Figure 4:
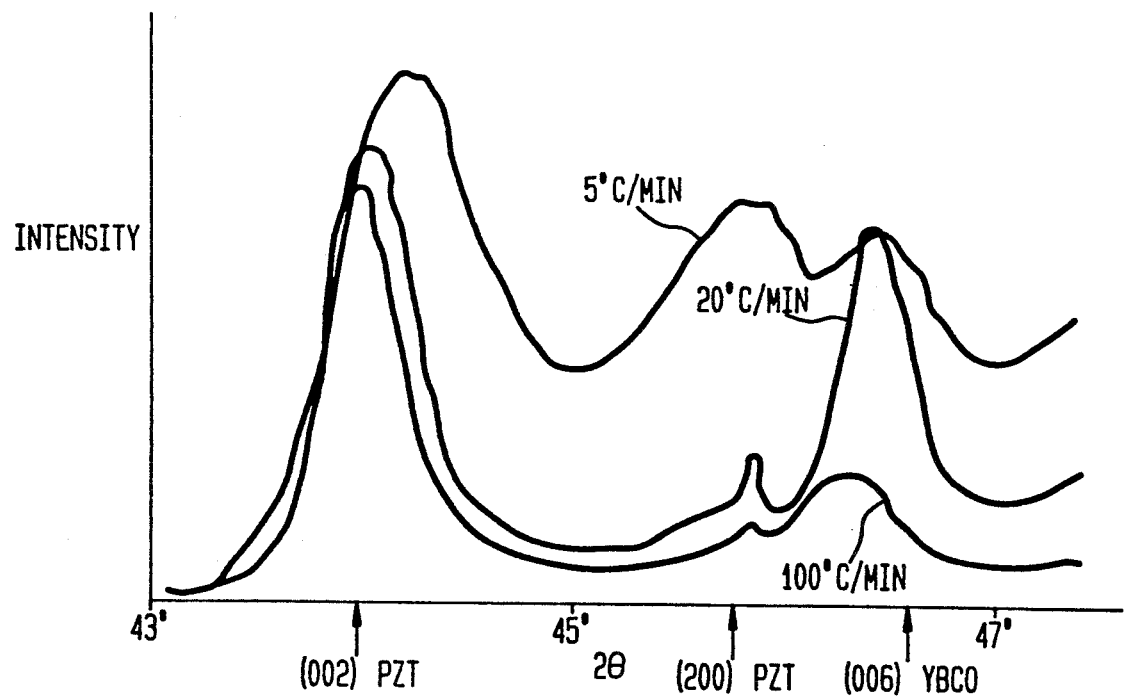
FIG. 4 is a graph of x-ray data illustrating crystalline orientations as a function of cooling rate from the deposition temperature.

The crystal structure of the heterostructures was then tested by X-ray diffraction. FIG. 4 shows the diffraction pattern for heterostructures cooled at 5°, 20°, and 100° C./min. The figure also indicates the anticipated positions for the (002) and (200) peaks of PZT, indicative of c-axis and a-axis oriented tetragonal PZT respectively, and the (006) peak of YBCO, indicative of c-axis oriented, orthorhombic YBCO.

At the cooling rate of 5° C./min, substantial amounts of both a-axis and c-axis oriented PZT were observed, but the peaks were relatively broad. The (006) YBCO peak was strong but broad. At the cooling rate of 20° C./min, the a-axis oriented PZT had virtually disappeared. The (006) YBCO peak remained strong and was further narrowed. At the cooling rate of 100° C./min, the a-axis orientation was further suppressed. However, the (006) YBCO was both shifted and reduced. It is believed that the relatively fast cooling rate prevents the YBCO from absorbing enough oxygen to transform to the low-temperature orthorhombic phase needed for superconducting YBCO.

Figure 5:
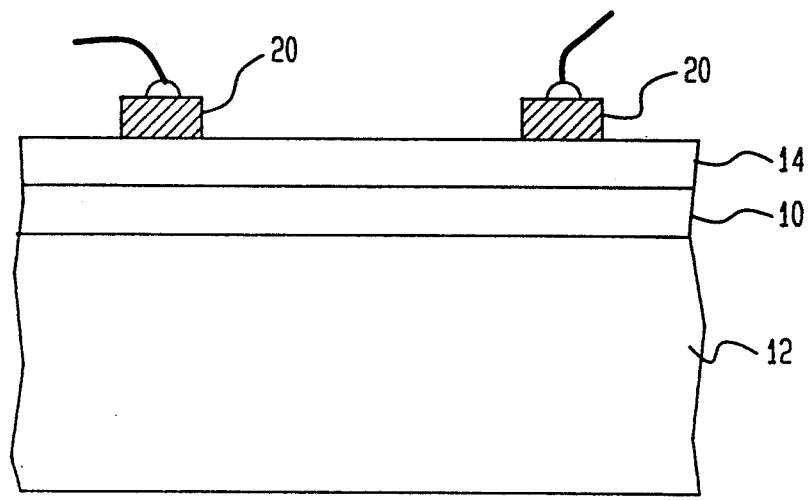
FIG. 5 is a cross-section of a test device used in evaluation of the invention.
}

A number of singly crystalline ferroelectric devices were fabricated at different cooling rates of 5°, 10°, 20°, 30°, 40°, 60°, and 100° C./min. The memory capacitor was formed by depositing, as illustrated in FIG. 5, two platinum/gold electrodes 20 separated by 20 μm on the upper surface of the PZT layer 14. The YBCO layer 10 acted as a virtual ground plane. After fabrication, the devices were tested for, among other parameters, remanent polarization, fatigue, and aging. The devices were fatigued by applying across the electrodes 20 a fixed number of cycles of an alternating bipolar 5 V pulse signal of 8.6 μs duration at a repetition rate of 40 kHz. Polarization characteristics were intermittently measured by applying a 5 V, 2 ms bipolar pulse and monitoring the integrated current, which is directly related to polarization.

Figure 6:
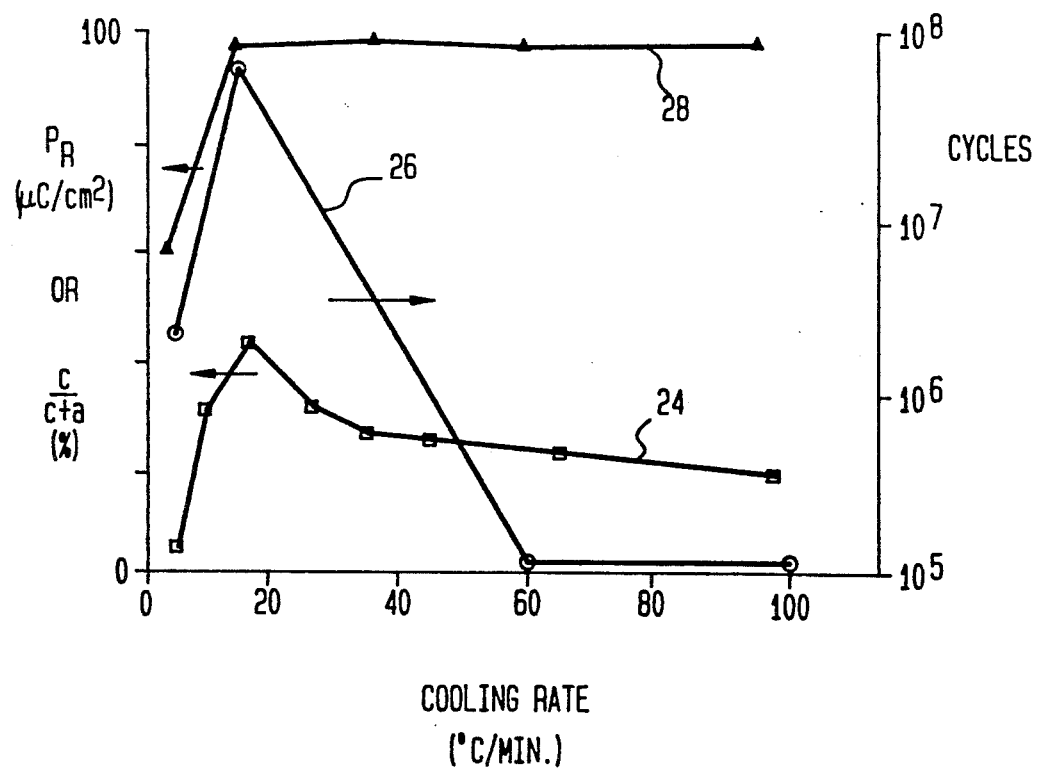
FIG. 6 is a graph illustrating the dependence of crystalline orientation and two polarization properties upon cooling rate.

Their remanent polarization $P_R$, which is the polarization remaining after the pulsing signal has returned to zero, was measured prior to any significant aging or fatigue, and the results are illustrated by line 24 connecting the squares in FIG. 6 and scaled along the left-hand ordinate. The fatigue behavior of the devices was then measured. Line 26 connecting the circles shows the number of fatigue cycles, expressed according to the scale of the right-hand ordinate, after which the differential remanent polarization $\delta P$ decreased to half of its original value. The differential remanent polarization is the difference in polarization between the switching and non-switching pulses. These data show that a 20° C. cooling rate is the best of those tested. Satisfactory results were obtained within a range of 10° to 40° C., preferably 15° to 30° C. Line 28, connecting the triangles, shows the volume fraction $c/(c+a)$ of the PZT having c-axis orientation, as scaled in percentage along the left-hand ordinate. This fraction was obtained by integrating the intensities of the PZT (002) and (200) x-ray diffraction peaks similar to those presented in FIG. 4 to determine the values of c and a respectively. The orientation data show greater than 80% a-axis orientation at 15° C./min, and greater than 90% at 20° C./min.

It appears that very low cooling rates permit multiple domains to form which allow the formation of a-axis oriented PZT. Although very high cooling rates promote c-axis orientation, they also introduce interfacial defects and eventual degradation in the YBCO.

Figure 7:
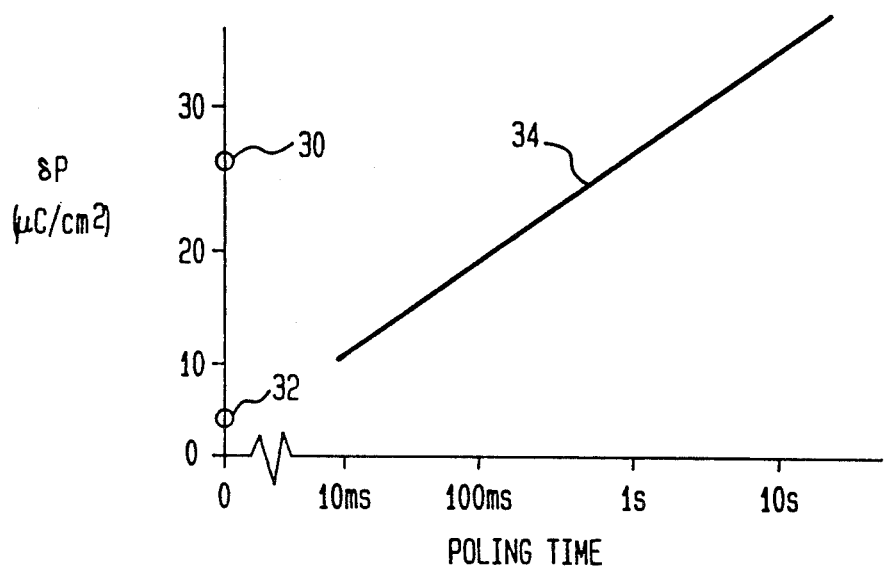
FIG. 7 is a graph of rejuvenation data.

The fatigue data show a useful life of about $10^8$ cycles for optimal cooling, which is remarkable and is probably quite satisfactory for many applications in which non-volatile memories would be used. However, volatile memories are often subject to an operation specification of $10^{15}$ cycles. However, it has been discovered that the useful life of PZT/YBCO memories can be extended by rejuvenating them with a longer pulse of the same magnitude as the fatiguing pulse. After the memory element of FIG. 5 had been subjected to $10^9$ fatigue cycles, a DC pulse of 5 V and 2 sec duration was applied to the memory element. Thereupon, the hysteretic polarization characteristics of the memory element returned nearly to their initial values. More complete data for other devices are shown in FIG. 7. Prior to fatiguing, the device had an initial state 30 in which they could switch polarization of 27 μC/cm$^2$. After $1.7 \times 10^9$ cycles at 5 V, it exhibited a fatigued state 32 in which the differential remanent polarization $\delta P$ was reduced to 4 μC/cm$^2$. Thereafter, as illustrated by a recovery line 34, the device could be rejuvenated by a 5 V DC pulse to an extent that depended logarithmically on the poling time, that is, the duration of the DC pulse. At about 1 to 2 sec, the device was completely rejuvenated. The recovery can be greater than the degradation from the initial state. Although this effect is not completely understood, it is believed to arise because all measurements for switched polarization used a 2 ms long bipolar pulsing sequence. Bipolar poling increases the recovery, and the polarity of unipolar poling is important when one of the electrodes is a polycrystalline metal other than the cuprates. For symmetrical electrodes, such as YBCO on top and bottom, the recovery is also symmetric.

This effect is similar to the pulse poling reported by Scott et al. in "Raman spectroscopy of submicron KNO$_3$ film. II. Fatigue and space-charge effects," *Journal of Applied Physics*, volume 64, 1988, pp. 1547–1551, but they used poling pulses of considerably larger magnitude than their fatiguing pulses, typically three times the fatiguing voltage, which is not compatible with the semiconductor power supplies typically of 3–5 V. Some comparative devices were fabricated on top of platinum electrodes by the conventional sol-gel process so that the ferroelectric was polycrystalline. They only partially recovered with a poling pulse of 5 V and 2 sec.

The devices of the invention also exhibit recovery with shorter poling pulses when the poling pulse is larger in magnitude. For example, a 14.5 V poling pulse produces complete recovery in 2 ms. However, the experiments showed that substantially the same poling and data writing/probing voltages can be used so that the memory element can be periodically rejuvenated not by applying a special voltage but by only lengthening the period of the applied voltage.

Figure 8:
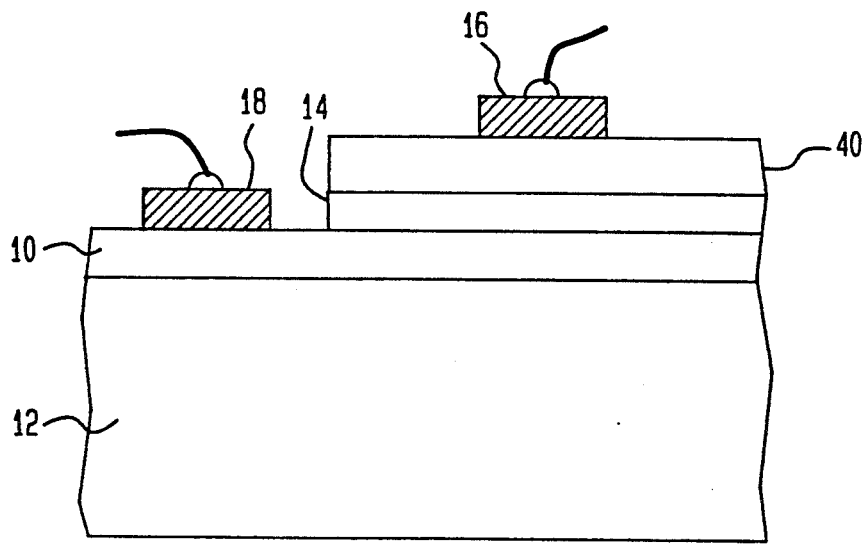
FIG. 8 is a cross-sectional view of a symmetric ferroelectric memory element of the invention.

The use of the metallic upper electrode in FIG. 1 is disadvantageous because it produces an asymmetric device. Hence, it would be advantageous to fabricate a ferroelectric memory element, illustrated in FIG. 8, having a symmetric structure. Specifically, an upper YBCO layer 40 is epitaxially formed on the PZT layer 14, and both the metallic contacts 18 and 16 are formed on the YBCO layers 10 and 40. This structure resembles the Josephson junction disclosed by Hegde et al. in U.S. Pat. No. 5,087,605. However, this structure may be disadvantageous if both the YBCO layers 10 and 40 are fabricated to have a c-axis orientation. Good quality c-axis oriented YBCO is epitaxially formed at elevated temperatures at which the lead in the PZT layer 14 may sublime or otherwise come out of the alloy. Furthermore, these elevated temperatures may be incompatible with CMOS processing in a silicon/ferroelectric integrated circuit. Hence, it is disadvantageous to form the upper YBCO layer 40 to have a c-axis orientation. However, it is well known that a-axis oriented YBCO is formed at somewhat lower temperatures, as disclosed by Inam et al. in U.S. patent application, Ser. No. 07/531,255, filed May 31, 1990, incorporated herein by reference, and in "a-axis oriented epitaxial YBa$_2$Cu$_3$O$_{7-x}$-PrBa$_2$Cu$_3$O$_{7-y}$ heterostructures," *Applied Physics Letters*, volume 57, 1990, pp. 2484–2486.

EXAMPLE 2

Accordingly, laser ablation was used to deposit the lower YBCO layer 10 as an a-axis oriented film by maintaining the substrate heater temperature at 700° C. and to deposit the PZT layer 14 as a c-axis oriented film at 640° C. The upper YBCO layer 40 was deposited with the substrate heater temperature beginning at 640° C. and increasing to 700° C. as the layer 40 increased in thickness. The lower-temperature portion prevented the lead from subliming while the higher-temperature portion provided a higher-quality a-axis oriented YBCO.

After these devices were configured with contacts as illustrated in FIG. 5, they were electrically tested. After $10^{12}$ bipolar cycles at 5 V, their differential remanent polarization decreased by 15%. This loss could be recovered by pulse poling. Some devices were aged immediately after $10^{12}$ fatigue cycles. They exhibited good aging characteristics of 2% decay per decade of time.

In the above example, c-axis oriented PZT was grown on top of a-axis oriented YBCO. A comparison of the crystalline structures of FIGS. 2 and 3 and the lattice parameters of the table show that this heterostructure is not epitaxial in the usual sense, but the long lattice spacing of the YBCO can still provide an effective template for at least two of the short lattice spacings of the PZT. A comparison of the lattice spacings of YBCO shows that it is very difficult to distinguish between the a-axis and b-axis orientations in perovskites, and both are included within this description of a-axis orientation and are sometimes referred to commonly as a,b-axis oriented.

The growth of a,b-axis oriented YBCO by use of a temperature gradation followed from work directed to improving and simplifying the oriented growth of high-$T_c$ superconductors disclosed in the patent application to Inam et al. They deposited a layer of $PrBa_2Cu_3O_{7-y}$ (PrBCO) at a lower temperature favoring a-axis oriented growth, stopped the growth while the temperature was raised to one favoring c-axis growth, typically a period of 15 minutes, and restarted growth of YBCO. Despite the higher temperature, the PrBCO template layer forced the overlying YBCO to grow in an a,b-axis orientation and to have a higher quality than a,b-axis oriented films grown at lower temperatures. However, use of PrBaCuO is disadvantageous when current needs to pass through the template layer since PrBCO is semiconductive.

Figure 9:
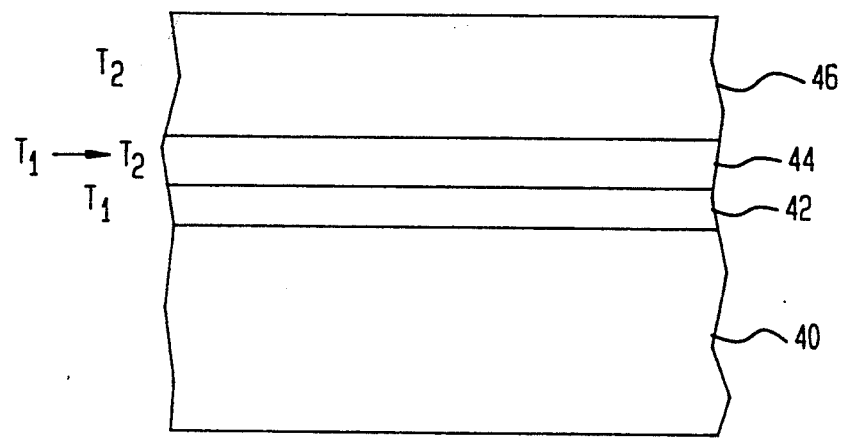
FIG. 9 is a cross-sectional view of an a-axis oriented heterostructure grown according to the invention.

According to this aspect of the invention, as illustrated in FIG. 9, there is epitaxially grown upon a crystalline substrate 40 a lower perovskite layer 42 at a temperature or other growth conditions favoring a,b-axis oriented growth. The crystalline substrate 40 may be a bulk substrate typical for perovskite thin films, such as, $SrTiO_3$ or $LaAlO_3$, a c-axis oriented perovskite thin film, or a tetragonal ferroelectric layer, among other possibilities. Then, without a significant interruption of growth, a perovskite transition layer 44 is epitaxially grown on the lower perovskite layer 42. The temperature (or other growth condition) during deposition of the transition layer 44 gradually increases from the temperature (growth condition) favoring a,b-axis oriented growth to that favoring c-axis oriented growth. Once the c-axis growth temperature is reached, an upper perovskite layer is deposited at that temperature. Nonetheless, it epitaxially forms as an a,b-axis oriented film.

EXAMPLE 3

A series of such a,b-axis oriented heterostructures were grown by pulsed laser ablation upon a substrate 40 of $LaAlO_3$. All growth rates were approximately 0.01 nm/sec. The lower perovskite layer 42, either of YBCO or PrBCO, was deposited to a thickness of 30–50 nm at a substrate heater temperature of about 700° C. This temperature favors growth of a-axis oriented perovskite films. Then, the transistion layer 42 composed of YBCO was deposited while the substrate temperature was gradually and continuously raised from 700° C. to about 800° C. at a rate of between 6° and 7°/min. The higher temperature favors growth of c-axis oriented perovskite films. If the lower perovskite layer 42 was YBCO, the deposition was uniformly continuous, and if it was PrBCO, the deposition changed from PrBCO to YBCO without interruption. At the growth rate of 0.01 nm/sec, the transition layer 42 had a thickness of 10 nm, that is, a plurality of unit cells, and the growth-temperature gradient was about 10° C./nm. The temperature was maintained at 800° C. for the growth of the upper perovskite layer 46 of YBCO.

X-ray experiments demonstrated that at least 95% of the upper perovskite layer 46 formed in a,b-axis orientation despite its being grown at a temperature favoring c-axis oriented growth. That is, the a-axis oriented lower perovskite layer 42 acted as a template. Rutherford back scattering showed that the orientational interface was less abrupt than when the heterostructure was growth without a transition layer 42, that is, than when the growth was interrupted during the temperature change. The results were the same whether the lower perovskite layer 42 was YBCO or PrBCO.

The superconducting transport properties of the heterostructures grown with a gradual temperature transition showed a marked improvement. The superconducting transition temperature of the YBCO remained at above 92° K, but its transition width was considerably sharper. Within the plane of the YBCO film 46, the critical current density increased by about a factor of ten to over $10^6$ A/cm$^2$. The microwave surface resistance and flux quantum noise were found to be comparable to those of c-axis oriented films.

It is beleved that the uninterrupted growth between the perovskite layers 42 and 46 prevents formation of an impurity layer, probably of upwardly migrating Ba and Cu during the long interruption required to raise the temperature in the prior practice. It is expected that a,b-axis oriented films grow with multiple domains with the long c-axis pointing in perpendicular directions in neighboring domains. An impurity layer could diffuse into the boundaries between the a,b-axis oriented domains and cause weak links between the domains. Thus, the uninterrupted growth of the invention prevents the formation of weak links within the YBCO plane, thereby improving the superconducting transport properties. This aspect of the invention is not limited to laser ablation but may be extended to other types of depositions and to other variations of growth conditions favoring different orientations of growth.

Figure 10:
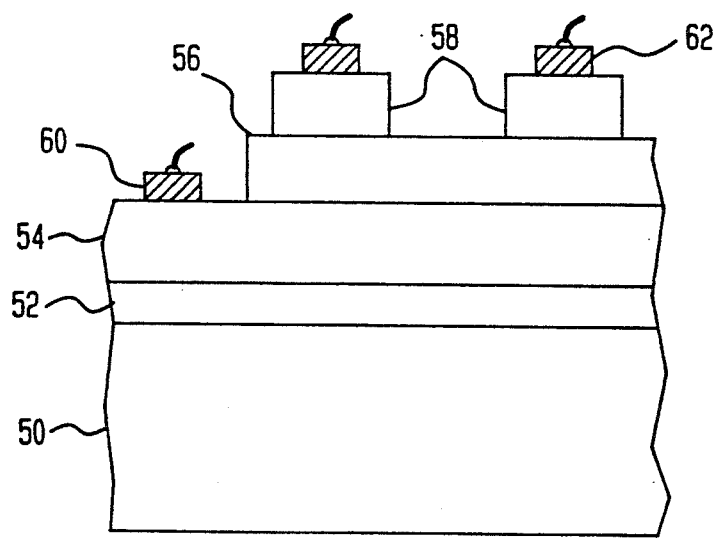
FIG. 10 is a cross-sectional view of singly crystalline ferroelectric memory array fabricated on a silicon substrate.

Commercial ferroelectric memory arrays should be fabricated on semiconductor substrates in order to integrate the support electronics and reduce costs. Such as array, illustrated in FIG. 10, is fabricated on a singly crystalline silicon substrate 50. A buffer layer 52 is deposited on the silicon substrate 50. Buffer layers are well known in superconductor technology to allow the growth of singly crystalline perovskite films on silicon substrates. Examples of materials for buffer layers are yttria-stabilized zirconia (YSZ) and MgO. A lower YBCO layer 54, preferably a-axis oriented, is deposited on the buffer layer 52, and a c-axis oriented ferroelectric layer 56 is deposited on the lower YBCO layer 54. An upper YBCO layer 58, preferably oriented symmetrically to the lower YBCO layer 54, is deposited on the ferroelectric layer 56 and patterned into separate YBCO electrodes 58. A side area is etched down to the lower YBCO layer 54. A metallic contact 60 is deposited on the lower YBCO layer 54, and separate metallic contacts 62 are deposited on the YBCO electrodes 58. Of course, the illustrated contacts are only symbolic of the metallic leads which would be used in a silicon/ferroelectric integrated circuit.

EXAMPLE 4

A ferroelectric memory capacitor on a silicon substrate was fabricated by pulsed laser ablation and then electrically tested. Its layered structure followed that of FIG. 10. The buffer layer 52 was 100 nm of fully stabilized (9 mole % Y) YSZ on a (001)-oriented silicon substrate 50. Both the YBCO layers were made to be a-axis oriented by the temperature gradient method. The structure was laterally unpatterned but was contacted with two gold electrodes on the upper YBCO layer, similarly to FIG. 5. The fatigue data closely followed that for the similar device with a LaAlO$_3$ substrate.

EXAMPLE 5

Another silicon/ferroelectric heterostructure having a-axis oriented YBCO was fabricated in which 30 nm of the lower YBCO layer 10 was grown at 680° C. so as to guarantee an a-axis oriented template. The YBCO growth then continued uninterrupted while the temperature was gradually raised to 800° C. in four minutes. Thereafter, another 70 nm of the lower YBCO layer 10 was grown. Subsequently, the PZT layer 14 and the upper a-axis oriented upper YBCO layer 40 were grown as described before. X-ray diffraction showed very less than 5% of the YBCO to have c-axis orientation while the PZT layer was completely c-axis oriented.

EXAMPLE 6

A silicon/ferroelectric heterostructure was fabricated having c-axis oriented YBCO for both its electrodes. The lower YBCO layer was grown at 810° C., and the PZT layer was grown at 640° C. Then, without interruption, 500 laser pulses deposited YBCO at 640° C. Thereafter, growth was interrupted while the temperature rose to 810° C. over four minutes for the deposition of the upper YBCO layer. After this device was fatigued for $10^{12}$ bipolar (i.e., ±5 V) cycles, the differential remanent polarization decreased by only 10–15%, which was recoverable by pulse poling. Thus, a-axis oriented YBCO is desirable but not essential, but a symmetric heterostructure is greatly preferable.

EXAMPLE 7

A series of ferroelectric memory capacitors of various structure were fabricated in which the ferroelectric layer was composed of Pb$_{0.9}$La$_{0.1}$Zr$_{0.2}$Ti$_{0.8}$O$_3$. The lanthanide alloying was used to increase the resistivity of the ferroelectric layer. Although these devices exhibited somewhat reduced remanent polarization, they could be fatigued to above $10^{12}$ cycles. Importantly, their resistance across the ferroelectric layer was increased by a factor of 20–50.

EXAMPLE 8

Additional ferroelectric memory capacitors were fabricated in which the ferroelectric layer was composed of PbZr$_{0.5}$Ti$_{0.5}$O$_3$. These were not electrically tested, but visual inspection showed them to have high surface quality, a good sign of high electrical quality. This ferroelectric alloy is popular in polycrystalline ferroelectric memories.

The preceding two examples demonstrate that the invention can be immediately applied to a wide range of the alloys Pb$_{1-y}$La$_y$Zr$_x$Ti$_{1-x}$O$_3$, where $0 \leq y \leq 1$ and $0 \leq x < 1$ although 10% is a typical upper limit for y and 65% is a typical upper limit for x. However, even other ferroelectrics may be used, as explained in the Ramesh et al. patent, for example, Bi$_4$Ti$_3$O$_{12}$, PbTiO$_3$, and LiNbO$_3$, among others.

The perovskite conductor may be one of the cuprate or bismuthal oxides of the classes known to exhibit superconductivity. The cuprate oxides include not only YBCO but other oxides for which Y is substituted by a lanthanide rare-earth metal, that is, Ce through Lu. PrBCO is generally a poor conductor but is known to be a good epitaxial template so that it would be useful if the metal oxide layer is not used as an electrode. The bismuthal oxides include Bi$_2$Sr$_2$Ca$_{n-1}$Cu$_n$O$_{4+2n+x}$, where n is a positive integer. The bismuthal oxides are well explored in high-T$_c$ superconductivity.

The invention provides a ferroelectric memory cell with superior electrical and aging characteristics. The large coercive fields and square hysteresis allow the ferroelectric to be directly contacted in a matrix addressing arrangement. That is, row electrodes can run in parallel beneath the ferroelectric layer and column electrodes run in the perpendicular direction above the ferroelectric layer, and both electrodes may directly contact the ferroelectric layer eliminating the need for transistorized gates. Such a structure can be made very dense.

The invention also provides a more flexible method of growing a-axis oriented perovskite films. Such films exhibit superior superconductive properties and can be advantageously used in devices other than ferroelectric memories.

What is claimed is:

1. A ferroelectric memory element, comprising:
   a singly crystalline body comprising a metal oxide chosen from the group consisting of cuprate oxide and bismuthal oxide, having a perovskite crystal structure, and being conductive;
   a ferroelectric layer epitaxially formed on said crystalline body, wherein at least 80% of said ferroelectric layer has a c-axis orientation.

2. A ferroelectric memory element as recited in claim 1, wherein at least 90% of said ferroelectric layer has said c-axis orientation.

3. A ferroelectric memory element as recited in claim 1, wherein said body comprises a first thin film.

4. A ferroelectric memory element as recited in claim 3, wherein said first thin film is substantially c-axis oriented.

5. A ferroelectric memory element as recited in claim 3, wherein said first thin film is substantially a-axis oriented.

6. A ferroelectric memory element as recited in claim 3 further comprising a second thin film formed over said ferroelectric layer having a substantially same crystalline orientation as said first thin film and wherein said first and second thin films comprise respective electrodes.

7. A ferroelectric memory element as recited in claim 3, wherein said metal oxide comprises YBaCuO.

8. A ferroelectric memory element as recited in claim 3, wherein said ferroelectric layer comprises PbZrTiO.

9. A method of forming a ferroelectric thin film, comprising the steps of:
a first step of depositing a ferroelectric layer comprising a ferroelectric material upon a singly crystalline body held at a deposition temperature at which said ferroelectric material is stable in a cubic phase; and
cooling said deposited layer through a transition temperature of said ferroelectric material lower than said deposition temperature and producing a transition in said ferroelectric material from said cubic phase to a non-cubic phase, said cooling being performed at a cooling rate lying within a range between 10° to 40° C./min.

10. A method as recited in claim 9, wherein said cooling rates lies within a range between 15° and 30° C./min.

11. A method as recited in claim 9, wherein said singly crystalline body comprises a thin film of a metal oxide chosen from the group consisting of cuprate oxide and bismuthal oxide, having a perovskite crystal structure, and being conductive and further comprising the step of depositing said thin film on a singly crystalline substrate.

12. A method as recited in claim 11, wherein said metal oxide comprises YBaCuO.

13. A method as recited in claim 12, wherein said ferroelectric material comprises PbZrTiO.

14. A method as recited in claim 13, wherein said transition temperature equals about 470° C.

15. A method as recited in claim 9, wherein said cooling step causes at least 80% of said layer of said ferroelectric material to have a c-axis orientation.

16. A method as recited in claim 9, wherein:
said singly crystalline body comprises a first perovskite layer;
said first depositing step includes a second step of depositing said first perovskite layer as an a,b-axis oriented film upon a second singly crystalline body; and
further comprising a third step of depositing a second perovskite layer as an a,b-axis oriented film upon said ferroelectric layer.

17. A method as recited in claim 16, wherein said third depositing step includes depositing said second perovskite layer while a deposition temperature is gradually raised from a first temperature favoring a,b-axis oriented growth to a second temperature favoring c-axis oriented growth and then holding said deposition temperature at said second temperature while said second depositing step continues.

18. A method of writing and rejuvenating a ferroelectric memory, comprising:
a first step of applying a voltage pulse of a first magnitude and a first duration to a ferroelectric memory comprising a singly crystalline ferroelectric material and a pair of electrodes to thereby write a datum in said memory; and
a second step of applying a voltage pulse of a magnitude approximately equal to said first magnitude and of a second duration very much larger than said first duration to said ferroelectric memory to thereby rejuvenate said memory for said first step.

19. A method as recited in claim 18, wherein each of said electrodes comprises a similarly oriented perovskite thin film of a same material.

20. A method of growing an oriented perovskite thin film, comprising the steps of:
depositing a perovskite thin film upon a crystalline substrate;
during said depositing step gradually changing deposition conditions from first growth conditions favoring formation of an a,b-axis oriented film to second growth conditions favoring formation of a c-axis oriented film, thereby forming a first portion of said thin film;
after completion of said changing step, without interruption continuing said depositing step at said second growth conditions to form a second portion of said thin film, whereby said second portion is formed as an a,b-axis oriented thin film.

21. A method as recited in claim 20, wherein said each of said first and second portions of said thin film comprises a common superconductive material.

22. A method as recited in claim 20, wherein said second growth conditions include a deposition temperature higher than a deposition temperature included in said first growth conditions.

23. A method as recited in claim 22, wherein said changing step changes said deposition temperature while said depositing step is depositing a plurality of unit cells of said thin film.

24. A method as recited in claim 20, wherein said depositing step deposits said thin film upon a ferroelectric layer at least 80% of which has a c-axis orientation.

* * * * *